United States Patent [19]
Emeigh et al.

[11] Patent Number: 5,767,698
[45] Date of Patent: Jun. 16, 1998

[54] HIGH SPEED DIFFERENTIAL OUTPUT DRIVER WITH COMMON REFERENCE

[75] Inventors: Roger Dale Emeigh; James Francis Mikos; David Lawrence Pease; James David Strom, all of Rochester, Minn.

[73] Assignee: International Business Machines Corporation, Armonk, N.Y.

[21] Appl. No.: 659,293

[22] Filed: Jun. 6, 1996

[51] Int. Cl.⁶ ............... H03K 19/0175; H03K 19/094
[52] U.S. Cl. .................. 326/83; 326/80; 326/84
[58] Field of Search .................. 326/83, 80, 82, 326/89, 84; 327/108, 109, 563

[56] References Cited

U.S. PATENT DOCUMENTS

| | | | |
|---|---|---|---|
| 4,691,127 | 9/1987 | Huizer | 326/82 |
| 4,999,519 | 3/1991 | Kitsukawa et al. | 326/84 |
| 5,021,682 | 6/1991 | Hobrecht | 307/296.8 |
| 5,105,107 | 4/1992 | Wilcox | 307/475 |
| 5,144,164 | 9/1992 | Sugimoto et al. | 326/84 |
| 5,216,298 | 6/1993 | Ohba et al. | 326/84 |
| 5,394,034 | 2/1995 | Becker et al. | 326/82 |
| 5,451,898 | 9/1995 | Johnson | 327/563 |
| 5,534,803 | 7/1996 | Correale, Jr. et al. | 327/108 |
| 5,568,068 | 10/1996 | Ota et al. | 326/82 |

FOREIGN PATENT DOCUMENTS 60-113507 6/1985 Japan.

Primary Examiner—Edward P. Westin
Assistant Examiner—Richard Roseen
Attorney, Agent, or Firm—Scott A. Stinebruner; Tyler L. Nasiedlak; Merchant, Gould, Smith, Edell, Welter & Schmidt

[57] ABSTRACT

A plurality of high speed differential output drivers are coupled to a reference current generator such that each output driver receives a substantially identical copy of a reference current signal for controlling one or more operational parameters (e.g., the propagation delay or skew) of the output driver. Multiple copies of the reference current signal are generated within the same region of an integrated circuit chip, thereby minimizing any process variations within the chip that might cause variances between the individual copies of the reference current signal. Each differential output driver has a differential pair of transistors that are coupled to ground or supply voltage through a common mode resistor that controls the common mode component of the driver output independent of the voltage swing of the output.

26 Claims, 5 Drawing Sheets

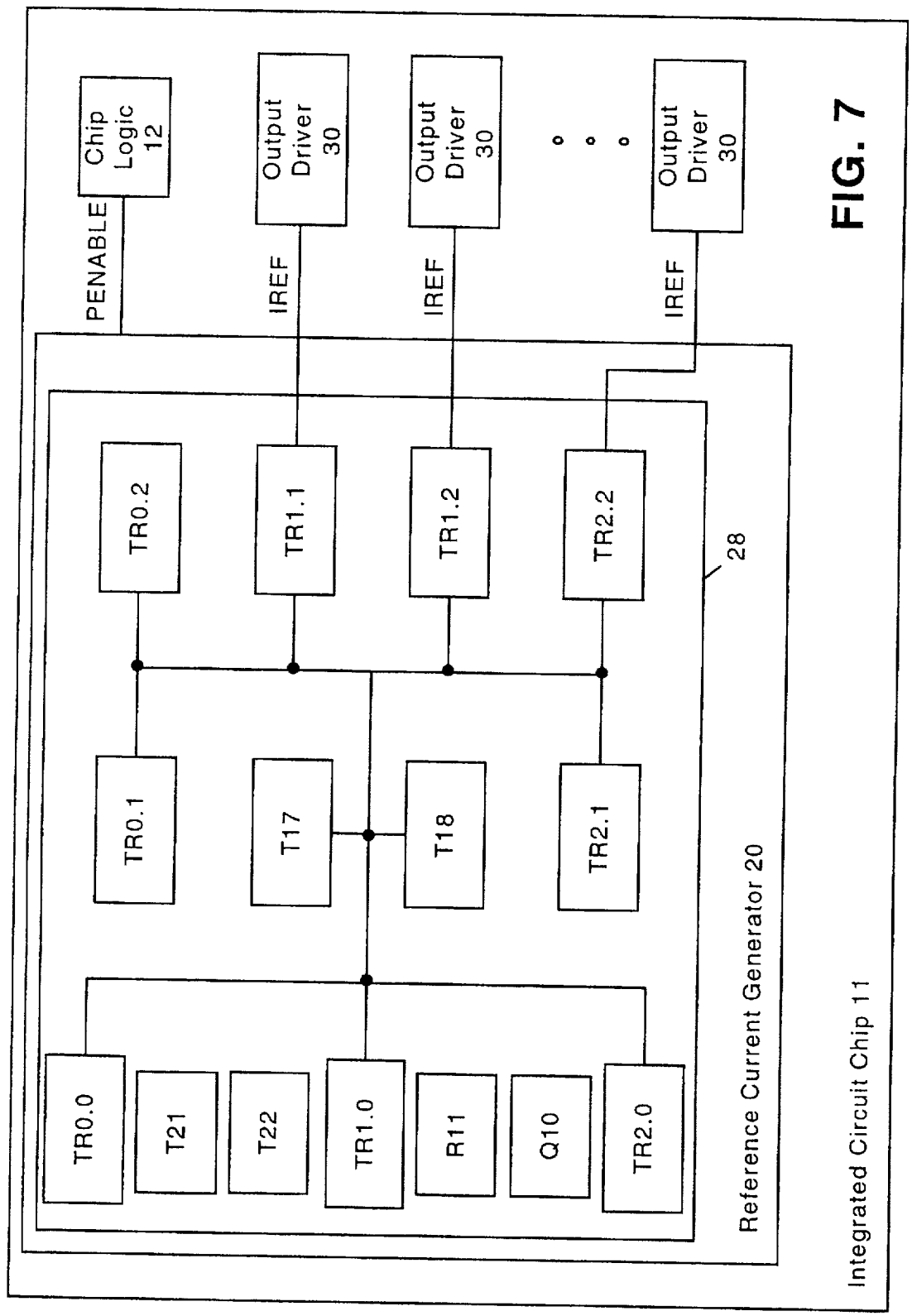

5,767,698

HIGH SPEED DIFFERENTIAL OUTPUT DRIVER WITH COMMON REFERENCE

FIELD OF THE INVENTION

The invention is generally related to differential output drivers for use in high speed applications. In addition, the invention is generally related to controlling operating parameters such as propagation delay of such output drivers to ensure reliable signal transmission in a networked environment.

BACKGROUND OF THE INVENTION

Greater communication bandwidth requirements over internal buses and other networked environments continuously requires improvements in communication protocols and hardware in signal transmission systems (i.e., systems where one or more signals are communicated between two or more electronic devices). For example, the IEEE has developed the Scaleable Coherent Interface (SCI) Standard (IEEE Standard 1596.3) which includes a Low-voltage Differential Signal (LVDS) Specification for communication at low voltages and at speeds up to 500 MHz. The LVDS specification relies on differential communication, where a pair of wires are used to transmit a digital signal. A logic one bit is represented by a higher voltage on one of the pair of wires, with a logic zero bit represented by a higher voltage on the other wire.

Differential signal transmission systems offer high speed signal transmission with relatively low voltage swings and good noise rejection. In general, the speed obtainable within a differential system is dependent upon the delay ($\Delta t$) in the system, which is a function of the capacitance (C) in the transmission line, the current (I) driving the line, and the voltage swing ($\Delta V$), or the voltage difference between logic one and logic zero states on the line, as follows:

$$\Delta t = C \times \frac{\Delta V}{I}$$

Capacitance is often difficult to change in a transmission system due to transmission line lengths and other concerns. Consequently, to increase the speed possible in a transmission system, it is typical to either decrease the voltage swing, or increase the current. Tradeoffs often must be made, however, because reducing voltage swing makes the system more susceptible to noise, while increasing the current increases power dissipation. While differential signal transmission offers significant improvements over non-differential protocols, there is nonetheless a continuing need to increase the speed of such systems without sacrificing reliability or substantially increasing power dissipation.

Significant demands are placed on communication devices (e.g., output drivers and receivers) in differential signal transmission systems. For example, one problem that faces differential signal transmission systems is that of matching output drivers and receivers. With the operating voltages of many hardware components being reduced for power dissipation and other concerns, it is possible for multiple operating, or supply, voltages to be found within a signal transmission system (e.g., 5.0 V, 3.3 V, 1.8 V). Further, different drivers and receivers may be biased at different reference points. These concerns are often increased in open signal transmission systems, where different components from different manufacturers may be connected in a system.

Also, it is often desirable to control the common mode component (i.e., the average DC voltage output level) of a transmission signal in addition to the current and voltage swing, as the common mode component of a transmission signal affects both the power dissipation and the noise rejection aspects of the system.

Conventional differential output drivers, however, are often biased to the power supply voltage and/or they do not permit the common mode component of transmission signals to be controlled easily. As such, often both output drivers and receivers within a conventional system must utilize the same operating voltage and must be otherwise be specifically designed to operate together. Moreover, device designs must often be specifically created for different operating voltages.

These limitations place significant burdens on system designers and greatly increase the difficulty of designing signal transmission systems. Therefore, a substantial need exists for a manner of providing differential signal communication in which the design of communication devices such as output drivers and receivers is more flexible and is not as dependent on operating voltages or other devices in a system.

Additional demands are placed on the hardware within differential as well as other signal transmission systems. For example, where multiple output drivers are used to distribute a signal (e.g., a clock signal) to multiple destinations, or to distribute multiple signals to one or more destinations (e.g., with serial or parallel communication), process variations within an integrated circuit chip (if the drivers are on the same chip) or between multiple chips (if the drivers are on separate chips) may vary one or more operating parameters of the individual drivers, e.g., propagation delay, relative to one another such that the drivers, while designed to share identical characteristics, do not closely track one another. Particularly in high speed systems where the effects of propagation delay are magnified, mismatched drivers can result in misaligned signals and a greater potential for transmission errors.

Attempts have been made to better control the operating parameters of output drivers to minimize any mismatches, as well as to minimize any deviations from designed parameters.

For example, output drivers have been designed to receive reference voltages to stabilize the outputs of the drivers. However, the reference voltages are often susceptible to power supply variations, and may be affected by voltage drops that may occur in different chips or regions of chips.

Moreover, output drivers have been designed to rely on another reference signal such as a current or a threshold voltage of a bias transistor. While the use of a current or a threshold voltage as a reference may reduce the influence of power supply variations, it has been found that process variations within an output driver integrated circuit chip often cause mismatches between output drivers located in different areas of the chip.

Consequently, a significant need also continues to exist for a manner of stabilizing and matching the operating parameters of multiple output drivers in a signal transmission system to provide reliably controlled signal transmission.

SUMMARY OF THE INVENTION

The invention addresses these and other problems associated with the prior art in providing in one aspect an apparatus with a plurality of output drivers coupled to a reference current generator such that each output driver receives a substantially identical copy of a reference current signal for controlling one or more operational parameters of the output driver. By using a reference current, the reference for each driver is, relative to every other driver, substantially insensitive to supply voltage variations, chip temperature variations, and process variations. Moreover, by using a common reference current for multiple output drivers, the drivers are permitted to track one another in response to any variations or sensitivities that may nonetheless remain in the reference current.

For example, when the common reference current signal is used to control the propagation delay of multiple drivers, the outputs of the drivers are substantially aligned with one another. Thus, in clocking applications, the multiple output drivers may be utilized to generate multiple clock signals that are aligned with one another. Further, in other applications, multiple signals sent to a common destination may be aligned with one another. In either instance, signal transmission speed may often be increased due to reduced concerns as to signal-to-signal misalignment. In any event, data reliability is increased for any given transmission speed.

In preferred embodiments of the invention, multiple copies of the reference current signal are generated within the same region of an integrated circuit chip, thereby minimizing any process variations within the chip that might cause variances between the individual copies of the reference current signal. Consequently, a precisely controlled reference signal may be conducted to different output drivers, regardless of their location on the chip, such that process variations that may exist between individual drivers do not cause operational differences between the drivers.

Therefore, in accordance with one aspect of the invention, there is provided an apparatus, which includes a reference current generator generating a reference current signal, the reference current generator outputting a plurality of copies of the reference current signal; and a plurality of output drivers, each output driver receiving a copy of the reference current signal to control an operating parameter of the output driver; whereby the plurality of output drivers collectively track one another in response to the reference current signal generated by the reference current generator.

In accordance with another aspect of the invention, there is provided a signal transmission system comprising a plurality of nodes interconnected with one another to transmit signals therebetween. Each node in the system includes a signal generator for generating a plurality of output signals; a reference current generator for generating a reference current signal, the reference current generator outputting a plurality of copies of the reference current signal; and a plurality of output drivers, each output driver receiving an output signal from the signal generator and transmitting the same to another node in the signal transmission system, each output driver further receiving a copy of the reference current signal from the reference current generator to control an operating parameter of the output driver.

The invention also addresses additional problems associated with the prior art in providing in another aspect a differential output driver having a differential pair of transistors that are coupled to a power signal (either ground or supply voltage) through a common mode resistor that controls the common mode component of the driver output independent of the voltage swing of the output. Greater design flexibility is obtained since the common mode component of the driver output can be optimized for speed, power dissipation, etc., without affecting the voltage swing. Moreover, smaller voltage swings may be possible through independent control of the common mode component, thereby increasing the speed of the driver without degrading noise rejection performance.

In preferred embodiments, the common mode resistor is coupled to ground to provide a ground bias for the output driver. The output of the driver is accordingly less dependent upon the operating voltage of the power supply. Consequently, a common driver design may be utilized for different operating voltages, and moreover, different communication devices within a signal transmission system may typically utilize different operating voltages without producing mismatches between devices in the system.

Therefore, in accordance with another aspect of the invention, there is provided a differential output driver that receives a pair of differential input signals and outputs a pair of differential output signals. The output driver is adapted to receive a pair of power signals, and the output driver includes a differential pair of first and second transistors coupled in parallel, the first and second transistors each receiving as input an input signal associated with one of the differential input signals and outputting an output signal associated with one of the differential output signals; and a common mode resistor, coupling the first and second transistors to one of the power signals; whereby the common mode resistor controls a common mode component of the pair of differential output signals independent of a voltage swing component of the pair of differential output signals.

These and other advantages and features, which characterize the invention, are set forth in the claims annexed hereto and forming a further part hereof. However, for a better understanding of the invention, and the advantages and objectives attained by its use, reference should be made to the Drawing, and to the accompanying descriptive matter, in which there is described preferred embodiments of the invention.

BRIEF DESCRIPTION OF THE DRAWING

FIG. 7 is a functional diagram illustrating the preferred component layout of a portion of the reference current generator of FIG. 6.

DETAILED DESCRIPTION OF THE PREFERRED EMBODIMENTS

Figure 3:
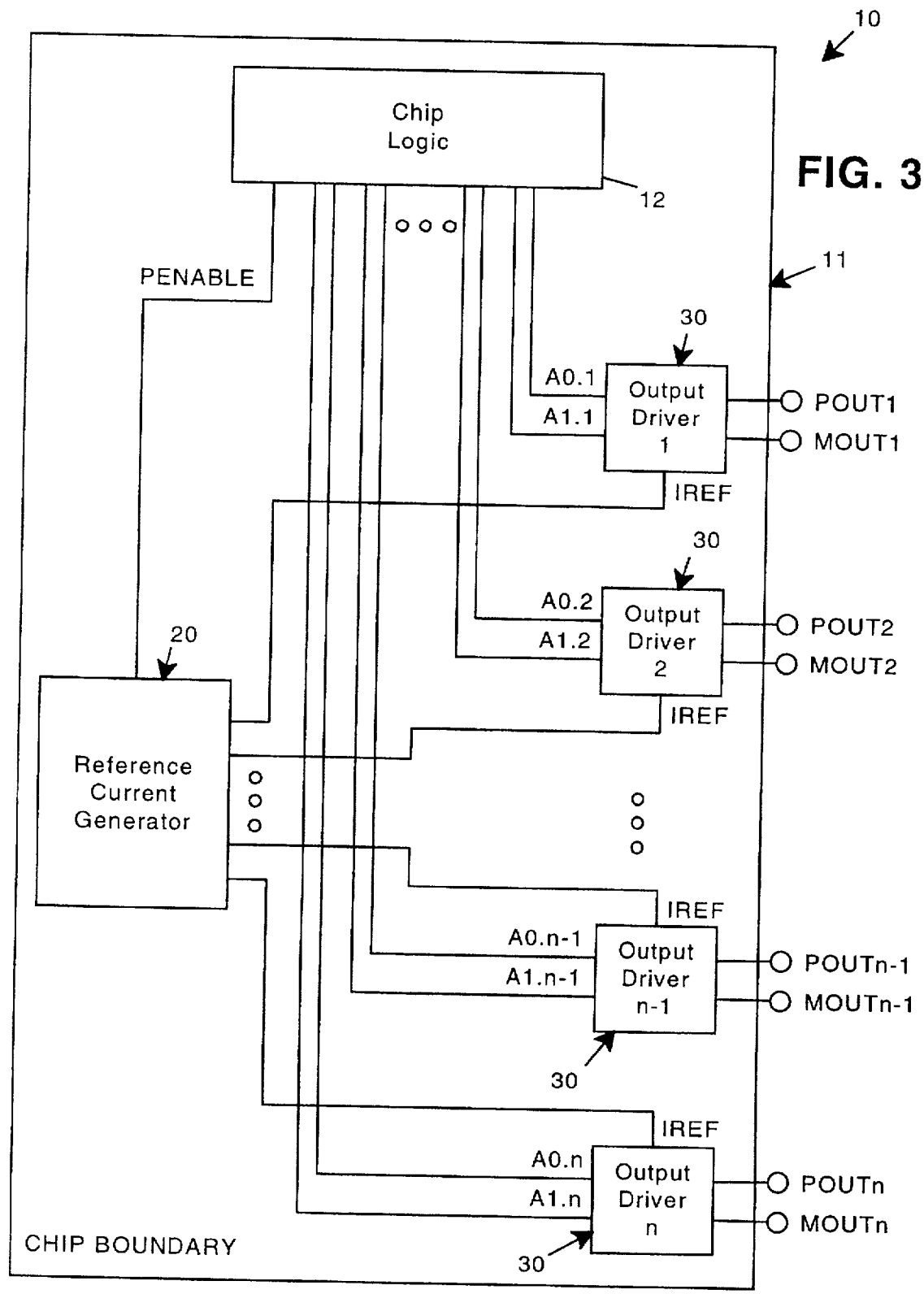
FIG. 3 is a functional block diagram of an integrated circuit chip consistent with the principles of the invention, for use in a node in either of the signal transmission systems of FIGS. 1 and 2.

Turning to the Drawing, wherein like numbers denote like parts throughout the several views, FIG. 3 illustrates an integrated circuit chip 11 consistent with the principles of the invention. Chip 11 generally includes chip logic, functionally illustrated as block 12, which generates a plurality of signals to be output from the chip. A plurality of output drivers 30 receive and output the signals as differential signals, and a reference current generator 20 generates a common reference current signal IREF to the output drivers such that the drivers track one another, in a manner which will be discussed in greater detail below.

Figure 1:
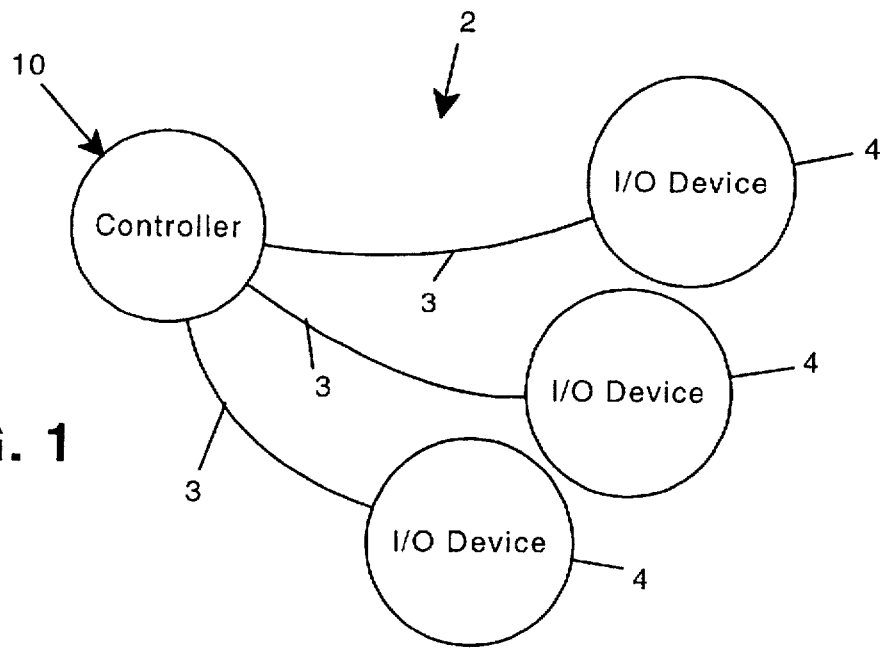
FIG. 1 is a functional block diagram of a first preferred signal transmission system consistent with the principles of the invention, where a plurality of I/O device are provided with a common signal such as a clocking signal from a controller.

Preferred embodiments of the invention may be utilized in numerous applications to control one or more operating parameters of output drivers coupled in a signal transmission system. For example, as shown in FIG. 1, a signal transmission system 2 may include a plurality of I/O devices 4 coupled to a node 10 operating as a central controller for the system. System 2 may represent, for example, the clocking distribution for a remote I/O bus that couples a processor and memory subsystem with I/O subsystems in a computer system such as the AS/400 minicomputer from International Business Machines Corporation.

To synchronize the operation of the I/O devices, the controller provides a plurality of clock signals 3 to the devices. Therefore, to ensure adequate synchronization between the devices, the output drivers within node 10 preferably have the same propagation delay such that the clock signals passed to each device are substantially aligned with one another.

Figure 2:
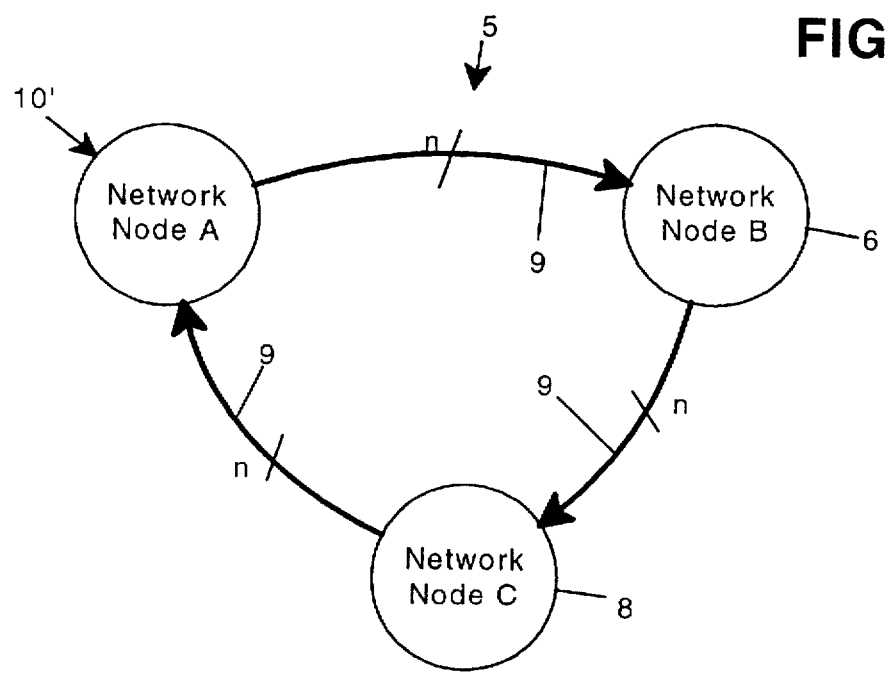
FIG. 2 is a functional block diagram of a second preferred signal transmission system consistent with the principles of the invention, where a plurality of networked nodes communicate with one another using multiple signals.

FIG. 2 illustrates another possible application for preferred embodiments of the invention. As shown in this figure, a signal transmission system 5 may be a multinode network with nodes 6, 8 and 10' coupled in a token ring configuration by a plurality of transmission lines 9. Each node outputs n signals to the next node in the ring. System 5 may represent, for example, a networked computer system which implements the IEEE Scaleable Coherent Interface (SCI) standard. It is desirable for reliability and speed concerns to align the n signals in each connection, and thus, the output drivers in each node preferably have the same propagation delay such that all signals passed between nodes are properly aligned with one another.

Numerous other applications of signal transmission systems, e.g., having at least one transmitting node and at least one receiving node, may be envisioned for use with the preferred embodiments of the invention. Further, it should be appreciated that transmitting and receiving nodes may each represent a single integrated circuit chip, a circuit having a plurality of chips, or a fully functional controller, computer system, or other electronic device coupled through a network. Moreover, the nodes may be coupled in any known point-to-point or bus network topology, e.g., fully connected, star, crossbar, mesh, and multidrop bus, among others. Therefore, the invention should not be limited to any particular network or node topology or components.

Returning to FIG. 3, a preferred integrated circuit chip 11 is illustrated. Chip 11 is shown as a part of node 10 from FIG. 1 representing a clock distribution chip for outputting multiple copies of a system clock signal to various devices coupled to node 10. In the alternative, chip 11 may be implemented in other applications, such as in node 10' of the system of FIG. 2.

Chip 11 generally includes a plurality of output drivers, e.g., drivers 30 which provide a plurality (n) of differential output pairs, POUT1/MOUT1, POUT2/MOUT2, ..., POUTn-1/MOUTn-1, and POUTn/MOUTn. The differential outputs preferably conform to the IEEE LVDS specifications of IEEE Standard 1596.3, although other output levels and specifications may also be used in the alternative.

Each of the n output drivers 30 receives a pair of differential inputs, A0.1/A1.1, A0.2/A1.2, ..., A0.n-1/A1.n-1, and A0.n/A1.n from a chip logic block (or signal generator) 12. Block 12 generally represents the primary logic circuitry of chip 11, which necessarily varies depending upon the function of chip 11. For example, chip 11 may be a microprocessor or microcontroller, whereby block 12 represents the processing circuitry of the chip. As another example, chip 11 may be a dedicated driver chip, whereby block 12 may represent input buffer logic which receives inputs from another chip and outputs differential representations thereof. In the example of a clock distribution chip, block 12 may represent a clock generator which generates a single differential clock signal at the desired frequency and outputs a plurality of copies thereof. In such an instance, a single differential clock signal may be output from block 12 and provided in parallel to the n output drivers 30.

Drivers 30 also receive as input a copy of a reference current signal (IREF) from a reference current generator 20. The reference current signal functions both as a reference signal to control one or more operating parameters of the drivers, as well as an enable signal for turning the drivers on or off as a group. Reference current generator 20 receives a PENABLE signal from block 12 to enable/disable the outputs of the plurality of drivers 30.

Figure 4:
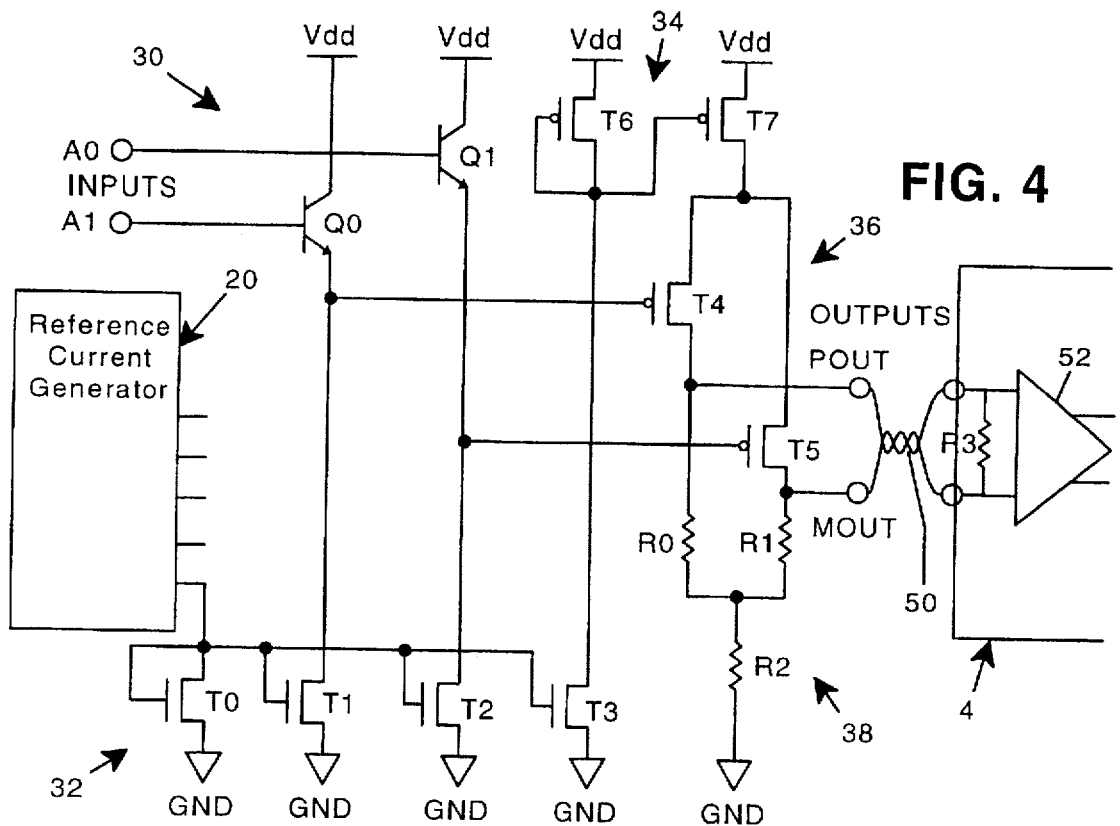
FIG. 4 is a schematic diagram of one of the output drivers from the chip of FIG. 3.

FIG. 4 illustrates one of the output drivers 30 in greater detail, with its outputs POUT/MOUT (with the numerical designators thereof now removed) coupled to a receiver 52 of a node 4 (see FIG. 1) through a twisted wire transmission line 50. A resistor R3 is shown terminating the transmission line, which is typically about 100Ω consistent with the LVDS specification. A pair of power signals, supply voltage signal $V_{DD}$ and ground signal GND, supply power to the driver.

Output driver 30 includes a differential pair 36 of transistors biased to ground through a resistor network 38. The driver is controlled with the reference current signal by a two stage current mirror having stages 32, 34.

Inputs A0 and A1 of driver 30 first pass through a pair of level shifting transistors Q0 and Q1 operating in a linear mode, which drop the voltage of each input by an amount equal to $v_{BE}$, the drop from the base to emitter of each transistor. Transistors Q0 and Q1 are preferably npn bipolar transistors, although n-type field effect (i.e., NFET or NMOS) transistors may be used in the alternative. Transistors Q0 and Q1 each have a gate terminal (the base) and first and second terminals (the collector and the emitter). It should be appreciated that, depending upon whether a transistor is bipolar or field effect, the gate, first and second terminals thereof may represent herein the base, collector, and emitter (if a bipolar) or the gate, source and drain (if a field effect). Moreover, as the source and drain of p-type and n-type field effect devices may often be reversed from one another, the first and second terminals may refer herein to either the source or drain of a transistor.

The first terminals of transistors Q0 and Q1 are coupled to the supply voltage, and the second terminals feed into the gate inputs of the differential pair 36 of first and second transistors T4 and T5. Transistors T4 and T5 act as switches to energize either POUT or MOUT depending upon input signals A0 and A1. If A0 is low and A1 is high, POUT goes low and MOUT goes high, and if A0 is high and A1 is low, POUT goes high and MOUT goes low.

Transistors T4 and T5 are biased to ground through a resistor network 38 with first and second resistors R0 and R1 and a common mode resistor R2. The addition of common mode resistor R2 permits the common mode component of the output driver output to be controlled substantially independently from the voltage swing of the output, since current flow occurs through resistor R2 irrespective of whether transistor T4 or T5 is turned on. Moreover, the resistors may typically be fabricated with highly controlled parameters using typical fabrication techniques, thus providing accurate control over the common mode component.

On the other hand, if resistor R2 is omitted (with resistors R0 and R1 terminating at ground), additional current, and thus power, is required to increase the common mode component of the output. Moreover, a greater voltage swing would accompany the additional current, thereby increasing the propagation delay through the driver.

Consequently, the use of common mode resistor R2 reduces power dissipation and increases driver speed. Moreover, the driver output may be tailored to a swing and a common mode component which are suitable for receiver 52, in a much simpler manner. In addition, since the resistor is coupled to ground, the same output driver design may be used with different supply voltages, and often the supply voltage of the receiver need not be matched with that of the output driver.

A two stage current mirror with stages 32, 34 controls the current through transistors T4 and T5 with a reference transistor T7 coupling the first terminals of transistors T4 and T5 with the supply voltage $v_{DD}$. The first stage 32 of the current mirror includes a transistor T0 with its second terminal coupled to ground and its gate and first terminals receiving the reference current signal IREF. Also, a transistor T3 has its second terminal coupled to ground and the gate terminal receiving the reference current signal IREF. Transistor T3 preferably has a width to length ratio (W/L) that is three times that of transistor T0, thereby scaling the reference current signal by a factor of three at its first terminal.

Second stage 34 includes transistor T6 and reference transistor T7. The gate terminals of transistors T6 and T7 and the second terminal of transistor T6 are coupled to the first terminal of transistor T3, while the first terminals of transistors T6 and T7 are coupled to the supply voltage $v_{DD}$. The second terminal of transistor T7 is coupled to the first terminals of transistors T4 and T5. Reference transistor T7 preferably has a W/L that is ten times that of transistor T6, thereby further scaling the reference current signal by a factor of ten, for an overall scaling of thirty. In the preferred embodiment, the reference current signal is about 0.4 mA, and thus the current drawn through reference transistor T7 and output from the driver is about 12.0 mA.

First stage 32 also includes a pair of transistors T1 and T2 which, similar to transistor T3, also receive the reference current signal at their gate terminals and are coupled to ground through their second terminals. The first terminals of transistors T1 and T2 are respectively coupled to the second terminals (emitters) of level shifting transistors Q0 and Q1. The W/L's of transistors T1 and T2 are preferably about five times that of transistor T0, thus scaling the reference current signal by a factor of five (2.0 mA in the preferred embodiment). The voltage at the first terminals of level shifting transistors Q0 and Q1 is dominated by transistors Q0 and Q1. Thus, transistors T1 and T2 operate to control the current through, and thus the speed of, transistors Q0 and Q1.

It should be appreciated that, in this configuration, the reference current signal IREF controls the overall speed (i.e., the propagation delay or skew) of driver 30. Moreover, IREF also controls the output levels (voltage swing and common mode component) of the driver. Further, if no reference current signal is received, the output of the driver goes low. Consequently, through appropriate control of the scaling factors of the reference current and the selection of resistors R0–R2, the output characteristics of driver 30 are easily and reliably controlled.

In output driver 30, transistors T0, T1, T2 and T3 are preferably n-type field effect transistors (i.e., NMOS or NFET), while transistors T4, T5, T6 and T7 are p-type field effect transistors (i.e., PMOS or PFET). The use of field effect transistors is preferred for speed considerations, although other types of transistors may be used in the alternative.

Figure 5:
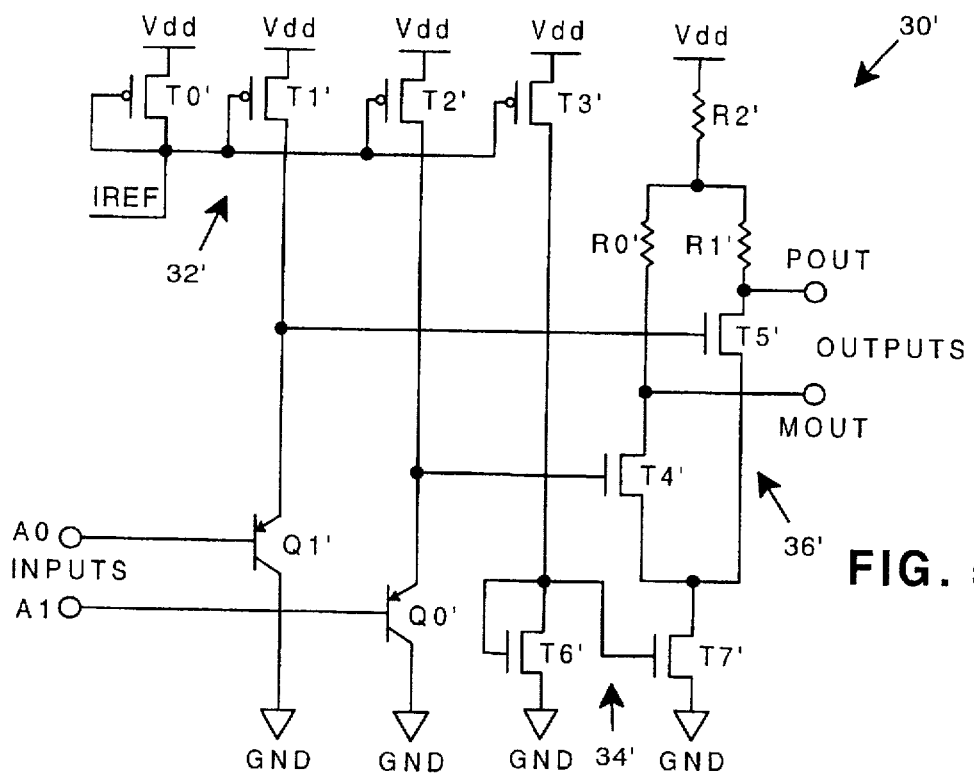
FIG. 5 is a schematic diagram of an alternate output driver to that of FIG. 4.

As another alternative, the components of driver 30 may be flipped, as illustrated by output driver 30' of FIG. 5, where corresponding components to those in driver 30 are designated by the same numbers, only primed. In this alternate design, transistors T0', T1', T2' and T3' are p-type field effect transistors tied to the supply voltage, transistors T4' and T5' are n-type field effect transistors biased to supply voltage through resistors R0', R1' and R2', and transistors T6' and T7' are n-type field effect transistors tied to ground. Level shifting transistors Q0' and Q1' are pnp bipolar transistors tied to ground, although p-type field effect transistors may be used in the alternative. Driver 30' operates in substantially the same manner as driver 30, although this design has a greater dependency on the supply voltage and as a result may introduce some receiver matching problems.

Returning to FIG. 4, in preferred output driver 30, resistors R0 and R1 are 100Ω resistors, while resistor R2 has a resistance of about 42Ω. Coupled with the 12 mA current through reference transistor T7 and the 100Ω termination on the transmission line, this results in a voltage swing of about 0.4 volts and a common mode component of about 1.1 volts. The current through transmission line 50 is about 4.0 mA and power dissipation is about 1.6 milliwatts (mW). With the length of the transmission line limited to 5 meters or less, the speed obtainable with driver 30 is about 500 MHz or greater. These operational characteristics of driver 30 are consistent with the IEEE LVDS specification. It should be appreciated that the operational characteristics of driver 30 may be tailored to implement other specifications as required.

The supply voltage $v_{DD}$ provided to driver 30 is preferably between about 3.0 and 3.8 Volts. However, different supply voltages may be used consistent with the invention. For example, integrated circuit chips are commonly designed to operate at 5.0, 3.3 and 1.8 Volt operating voltages, among others. As the resistor network 38 couples the differential pair 36 of transistors to ground; however, the same driver design may be utilized for the preferred range of supply voltages.

Depending upon the particular driver design, the reference current signal may be used to control a number of operating parameters of an output driver other than, or in addition to, the skew or output level of the driver. Other operating parameters which may be controlled at least in part by a reference current include output impedance, jitter, rise time, and symmetry, among others.

Figure 6:
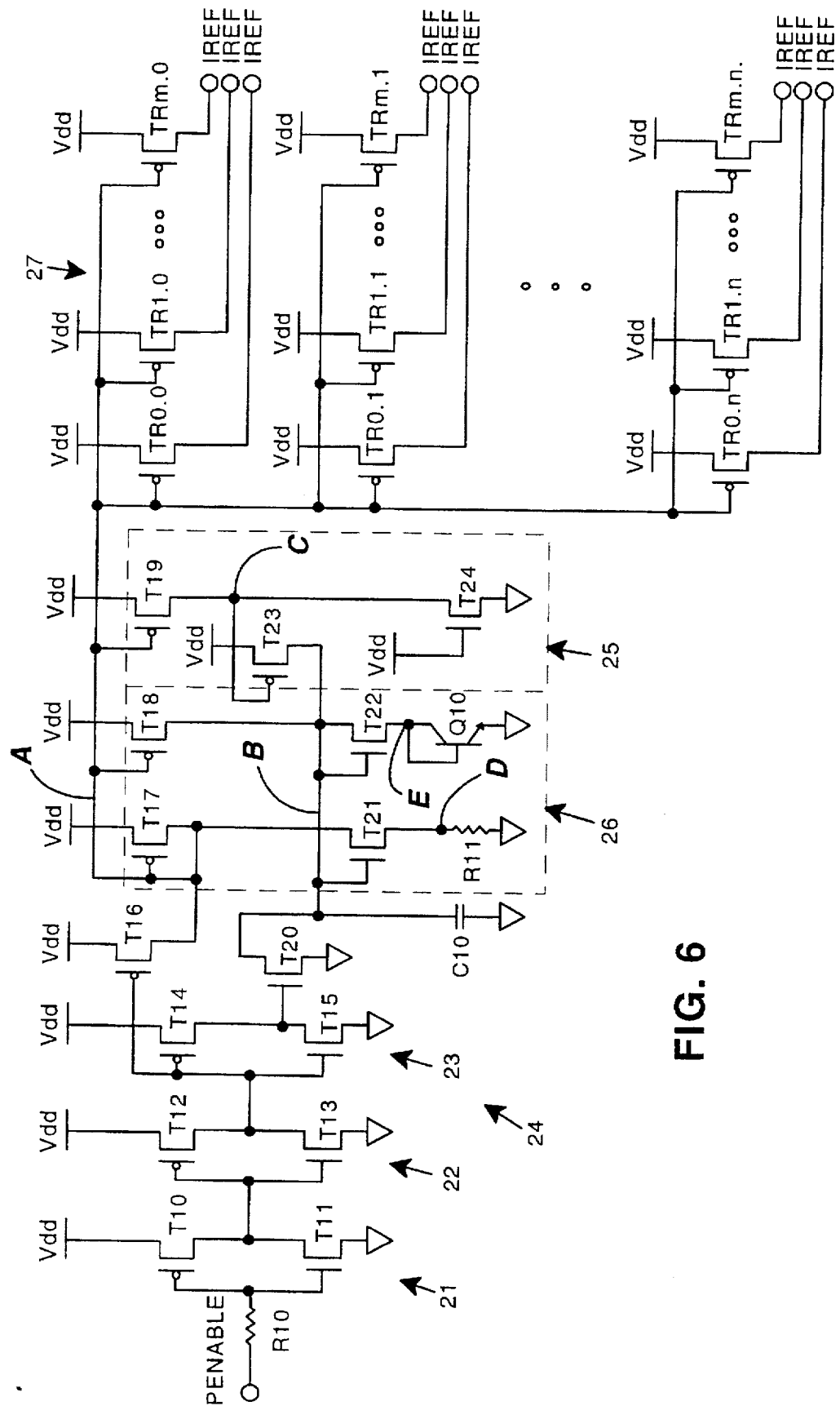
FIG. 6 is a schematic diagram of the reference current generator of FIG. 3.

As discussed above, each driver 30 in FIG. 3 receives a reference current signal IREF generated by reference current generator 20, which is shown in greater detail in FIG. 6. The primary purpose of generator 20 is to generate multiple precisely controlled copies of the reference current signal, although generator 20 also operates as an output enable circuit.

Generator 20 generally includes an output enable module or circuit 24, a startup module or circuit 25, a supply independent current reference module or circuit 26 and a current mirror module or circuit 27. The current mirror circuit includes a bank of m×n PFET output transistors, numbered TR0.0, TR0.1, . . . , TR0.n, TR1.1, . . . , TR1.n, . . . , TRm.0, TRm.1, . . . , TRm.n, which provide m×n copies of the current reference signal.

Output enable module 24 receives an active high PEN-ABLE enable signal from chip logic block 12 (FIG. 3) through a 1.0 KΩ resistor R10. The enable signal is then buffered through a pair of inverters 21, 22 with PFET transistors T10, T12 and NFET transistors T11 and T13, and passed to the gate terminal of a PFET transistor T16. A third inverter 23 with PFET transistor T14 and NFET transistor T15 also receives the buffered enable signal and provides a complementary (active low) enable signal to NFET transistor T20. In operation, if PENABLE is low, node A is driven high and node B is pulled to ground, thereby shutting off transistors T17, T18, T19, T21 and T22 and disabling the bank of output transistors TR0.0 to TRm.n. If, however, PENABLE is high, transistors T16 and T20 are shut off in a high impedance state, and thus do not affect nodes A and B.

PFET transistors T19 and T23 and NFET transistor T24 form startup circuit 25. Upon power-up, node C is initially low, which turns on transistor T23 to charge node B. Once node B goes high, this pulls node A low, thereby turning on transistor T19. Then, when transistor T19 turns on, node C is pulled high, thereby shutting off transistor T23 and completing the startup process. In addition, at this point node A remains low, which then turns on output transistors TR0.0 to TRm.n.

PFET transistors T17 and T18, NFET transistors T21 and T22, npn bipolar transistor Q10 and resistor R11 form supply independent current reference circuit 26. A capacitor C10 is also utilized for noise reduction and loop stability.

After startup, node B is charged high, which turns on transistor T22. Transistor Q10 has its base tied to its collector such that the transistor acts as a diode with a fixed voltage drop from the collector to the emitter.

Transistors T17 and T18 form a current mirror, and are preferably the same size, so the currents through nodes D and E must be the same. In addition, transistors T21 and T22 are preferably the same size as one another, so the voltages at nodes D and E must also be the same. Transistor Q10, coupled as a diode, sets the voltage at both nodes D and E to be the value of the voltage drop across the transistor—a value which is substantially independent of the supply voltage. With a known, supply independent voltage at node D, resistor R11 therefore controls the current through both nodes D and E, which is also substantially independent of the supply voltage.

As discussed above, output transistors TR0.0 to TRm.n form current mirror circuit 27. Each output transistor forms a current mirror with transistor T17, and thus outputs a scaled copy of the current through nodes D and E.

In the preferred embodiment, resistor R11 has a resistance of about 4.0 KΩ. With the fixed voltage drop of about 0.8 V across transistor Q10, the current through nodes D and E is about 0.2 mA. Further, each output transistor TR0.0 to TRm.n has a W/L ratio which is preferably twice that of transistor T17 such that the copy of the reference current signal output by each output transistor is twice that through nodes D and E. Consequently, each output transistor in the current mirror circuit of the preferred embodiment generates a reference current signal IREF of about 0.4 mA. It should be appreciated, however, that the size of each output transistor may be varied relative to transistor T17 to generate different reference current signals if desired. In addition, different sizes and values of components may be used to tailor the output of the reference current generator to any particular application.

As shown in FIG. 7, a preferred circuit topology is used to implement reference current generator 20 such that the copies of the reference current signal are carefully controlled. Most of the signal traces, with the exception of those relevant to the discussion herein, have been omitted from this figure for clarity. It should be appreciated however that the layout and fabrication of components on integrated circuit chips is in general known in the art, see, e.g., Weste et al., *Principles of CMOS VLSI Design: A Systems Perspective*, Addison-Wesley (1985).

In particular, in the preferred embodiment the output transistors TR0.0, . . . , TRm.n are all located proximate one another within the same region 28 of integrated circuit chip 11 to minimize any process variations between output transistors and thereby permit the output transistors to reliably track one another. Also, transistors T17 and T18 are preferably located within the same region 28 as the output transistors, most preferably in the middle of the region, to further minimize process variations. As a result, the preferred embodiment of the invention has been found to be capable of generating multiple 0.4 mA copies of a reference current signal which deviate from one another by less than one percent.

Various modifications may be made to the preferred embodiments without departing from the spirit and scope of the invention. For example, different reference current generating circuits may be used, including those which reference the reference current to the supply voltage rather than ground. However, it is preferred to utilize a supply independent reference current as well as to reference the generator to ground, as the design of the reference current generator becomes insensitive to the operating voltage of the power supply, thereby enabling the same design to be used for different supply or operating voltages (e.g., 5.0 V, 3.3 V or 1.8 V).

Moreover, different output driver circuits, differential or otherwise, may be used in the alternative. However, the preferred output driver design has been found to be particularly well suited for use in many signal transmission systems due to its speed, reliability, and independent control of the common mode and voltage swing components of the differential output. Moreover, by virtue of its bias to ground, matching between the output driver and a receiver is simplified, and the output driver and receiver do not necessarily have to utilize the same operating voltage. Also, the same output driver design may be used with different operating voltages as with the preferred reference current generator.

Additional modifications will be apparent to those of ordinary skill in the art. Therefore, the invention lies in the claims hereinafter appended.

What is claimed is:

1. An apparatus, comprising:
   (a) a reference current generator generating a reference current signal, the reference current generator outputting a plurality of copies of the reference current signal; and
   (b) a plurality of output drivers, each output driver receiving a copy of the reference current signal to control an operating parameter of the output driver; whereby the plurality of output drivers collectively track one another in response to the reference current signal generated by the reference current generator.

2. The apparatus of claim 1, wherein the reference current generator and the plurality of output drivers are disposed on an integrated circuit chip.

3. The apparatus of claim 2, wherein the integrated circuit chip further includes a logic block that generates a plurality of signals to be output through the plurality of output drivers.

4. The apparatus of claim 3, wherein the logic block comprises a clock generator that outputs a common clock signal as the plurality of signals; whereby the plurality of output drivers output substantially aligned clock signals.

5. The apparatus of claim 2, wherein the reference current generator includes a current mirror module having a plurality of output transistors that generate the plurality of copies of the reference current signal, and wherein the plurality of output transistors are disposed proximate one another in a region of the integrated circuit chip; whereby deviations between the copies of the reference current signal due to process variations in the integrated circuit chip are minimized.

6. The apparatus of claim 5, wherein the reference current generator includes a supply independent current reference module that generates the reference current signal in a manner that is independent of power supply voltage, at least a portion of the current reference module being disposed within the same region of the integrated circuit chip as the plurality of output transistors.

7. The apparatus of claim 5, wherein the reference current generator further includes an output enable module having an enable input, the output enable module controlling the output of the current mirror module, and wherein the copies of the reference current signal further operate as enable signals to the plurality of output drivers such that the output drivers are controlled as a group.

8. The apparatus of claim 1, wherein each output driver is a differential output driver receiving a pair of differential input signals and outputting a pair of differential output signals, the output driver further receiving a pair of power signals, the differential output driver comprising:

(a) a differential pair of first and second transistors coupled in parallel, the first and second transistors each receiving as input an input signal associated with one of the differential input signals and outputting an output signal associated with one of the differential output signals;

(b) a common mode resistor, coupling the first and second transistors to one of the power signals; and (c) a reference transistor coupling the first and second transistors to the power signal not coupled to the common mode resistor, the reference transistor receiving as input a reference signal associated with the copy of the current reference signal.

9. A differential output driver that receives a pair of differential input signals and outputs a pair of differential output signals, the output driver adapted to receive a pair of power signals, the output driver comprising:

(a) a differential pair of first and second transistors coupled in parallel, the first and second transistors each receiving as input an input signal associated with one of the differential input signals and outputting an output signal associated with one of the differential output signals; and (b) a common mode resistor, coupling the first and second transistors to one of the power signals; whereby the common mode resistor controls a common mode component of the pair of differential output signals independent of a voltage swing component of the pair of differential output signals.

10. The output driver of claim 9, wherein the common mode resistor is coupled to ground.

11. The output driver of claim 9, further comprising first and second resistors, the first and second resistors respectively coupled in series with the first and second transistors between the respective transistor and the common mode resistor.

12. The output driver of claim 11, wherein the output driver receives a current reference signal to control at least one operating parameter of the driver, the output driver further comprising a reference transistor coupling the first and second transistors to the power signal not coupled to the common mode resistor, the reference transistor receiving as input a reference signal associated with the current reference signal.

13. The output driver of claim 12, wherein the reference transistor is coupled in a current mirror, the current mirror receiving as input the current reference signal.

14. The output driver of claim 13, wherein the current mirror includes:

(a) a first stage comprising third and fourth transistors, the first stage receiving the current reference signal and outputting a first scaled copy of the current reference signal, (b) a second stage comprising a fifth transistor and the reference transistor, the fifth transistor receiving the first scaled copy of the current reference signal.

15. The output driver of claim 14, wherein the first, second, third, fourth, fifth and reference transistors each have a gate terminal and first and second terminals, and wherein:

(a) the gate terminals of the third and fourth transistors and the first terminal of the third transistor receive the current reference signal;

(b) the second terminals of the third and fourth transistors are coupled to the power signal that is coupled to the common mode resistor;

(c) the first terminal of the fourth transistor is coupled to the second terminal of the fifth transistor and to the gate terminals of the fifth and reference transistors;

(d) the first terminals of the fifth and reference transistors are coupled to the power signal that is not coupled to the common mode resistor;

(e) the second terminal of the reference transistor is coupled to the first terminals of the first and second transistors; and (f) the second terminals of the first and second transistors are respectively coupled to the first and second resistors.

16. The output driver of claim 15, further comprising first and second level shifting transistors, each receiving one of the differential input signals and outputting an input signal to the gate terminal of one of the first and second transistors.

17. The output driver of claim 16, further comprising sixth and seventh transistors, wherein the first and second level shifting transistors and the sixth and seventh transistors each have a gate terminal and first and second terminals, and wherein:

(a) the gate terminals of the first and second level shifting transistors each receive one of the differential input signals;

(b) the first terminals of the first and second level shifting transistors are coupled to the power signal that is not coupled to the common mode resistor;

(c) the second terminals of the first and second level shifting transistors are respectively coupled to the gate terminals of the first and second transistors;

(d) the gate terminals of the sixth and seventh transistors receive the current reference signal;

(e) the second terminals of the sixth and seventh transistors are coupled to the power signal that is coupled to the common mode resistor; and (f) the first terminals of the sixth and seventh transistors are respectively coupled to the gate terminals of the first and second transistors.

18. The output driver of claim 17, wherein the common mode resistor is coupled to ground, and the reference transistor is coupled to supply voltage, wherein the first, second, fifth and reference transistors are p-type field effect transistors (PFETs), and wherein the third, fourth, sixth and seventh transistors are n-type field effect transistors (NFETs).

19. The output driver of claim 18, wherein the first and second level shifting transistors are npn bipolar transistors.

20. The output driver of claim 17, wherein the common mode resistor is coupled to supply voltage, and the reference transistor is coupled to ground, wherein the first, second, fifth and reference transistors are n-type field effect transistors (NFETs), and wherein the third, fourth, sixth and seventh transistors are p-type field effect transistors (PFETs).

21. A signal transmission system, comprising a plurality of nodes interconnected with one another to transmit signals therebetween, wherein each node comprises:

(a) a signal generator for generating a plurality of output signals;

(b) a reference current generator for generating a reference current signal, the reference current generator outputting a plurality of copies of the reference current signal; and (b) a plurality of output drivers, each output driver receiving an output signal from the signal generator and transmitting the same to another node in the signal transmission system, each output driver further receiving a copy of the reference current signal from the reference current generator to control an operating parameter of the output driver.

22. The system of claim 21, wherein the reference current signal controls the propagation delay of each output driver.

23. The system of claim 22, wherein the signal generator comprises a clock generator that outputs a clock signal to the plurality of output drivers; whereby the plurality of output drivers output clock signals that are substantially aligned with one another.

24. The system of claim 22, wherein at least two of the plurality of output drivers are coupled to receivers in the same node in the signal transmission system, and wherein the output signals output from the two output drivers are substantially aligned with one another.

25. The system of claim 21, wherein each output driver is a differential output driver receiving a pair of differential input signals and outputting a pair of differential output signals, the differential output driver comprising:

(a) a differential pair of first and second transistors coupled in parallel, the first and second transistors each receiving as input an input signal associated with one of the differential input signals and outputting an output signal associated with one of the differential output signals;

(b) a common mode resistor, coupling the first and second transistors to ground; and (c) a reference transistor coupling the first and second transistors to a supply voltage, the reference transistor receiving as input a reference signal associated with the copy of the current reference signal.

26. The system of claim 25, wherein the plurality of nodes includes first and second nodes, with one of the output drivers in the first node coupled to a receiver in the second node, and wherein the first and second nodes are powered by different supply voltages.

* * * * *